United States Patent
Kono

(10) Patent No.: US 8,334,478 B2
(45) Date of Patent: Dec. 18, 2012

(54) LASER TYPE SOLDERING APPARATUS

(75) Inventor: Hirofumi Kono, Minato-ku (JP)

(73) Assignee: Japan Unix Co., Ltd., Tokyo (JP)

( * ) Notice: Subject to any disclaimer, the term of this patent is extended or adjusted under 35 U.S.C. 154(b) by 730 days.

(21) Appl. No.: 12/523,266

(22) PCT Filed: Dec. 21, 2007

(86) PCT No.: PCT/JP2007/074633
§ 371 (c)(1),
(2), (4) Date: Jul. 15, 2009

(87) PCT Pub. No.: WO2008/087831
PCT Pub. Date: Jul. 24, 2008

(65) Prior Publication Data
US 2009/0294412 A1    Dec. 3, 2009

(30) Foreign Application Priority Data

Jan. 15, 2007 (JP) .................. 2007-006216
Apr. 11, 2007 (JP) .................. 2007-103861

(51) Int. Cl.
*B23K 1/005* (2006.01)
(52) U.S. Cl. ............... 219/121.65; 219/121.83
(58) Field of Classification Search ........... 219/121.63–121.72, 121.76, 121.77, 219/121.83, 129
See application file for complete search history.

(56) References Cited

U.S. PATENT DOCUMENTS

| | | | | |
|---|---|---|---|---|
| 3,419,321 A | * | 12/1968 | Barber et al. | 219/121.7 |
| 3,586,816 A | * | 6/1971 | Hagen | 219/121.63 |
| 5,728,993 A | * | 3/1998 | O'Neill | 219/121.67 |
| 6,664,504 B2 | * | 12/2003 | Bertez | 219/121.84 |

FOREIGN PATENT DOCUMENTS

| | | |
|---|---|---|
| JP | 48-11516 | 4/1973 |
| JP | 50 5257 | 1/1975 |
| JP | 52 104437 | 9/1977 |
| JP | 2 81757 | 6/1990 |
| JP | 2-81757 | 6/1990 |
| JP | 2 211994 | 8/1990 |

(Continued)

OTHER PUBLICATIONS

Office Action issued Sep. 20, 2011, in Japanese Patent Application No. 2007-103861 with English translation.

(Continued)

*Primary Examiner* — Samuel M Heinrich
(74) *Attorney, Agent, or Firm* — Oblon, Spivak, McClelland, Maier & Neustadt, L.L.P.

(57) ABSTRACT

Provided is a laser type soldering apparatus which performs soldering by projecting a laser beam on a to-be-soldered object, one of a plurality of optical lenses is a conical lens, wherein an incident surface or a emitting surface of the conical lens is a conical surface, and a central portion of the conical lens has a central hole having a diameter smaller than that of a circular laser beam that is incident to the conical lens, and the conical lens converts the circular laser beam to a double circular beam having a ring portion with a circular ring shape and a spot portion located at a center of the ring portion, so that the double circular beam is projected on the to-be-soldered object.

8 Claims, 7 Drawing Sheets

FOREIGN PATENT DOCUMENTS

| | | |
|---|---|---|
| JP | 4-52073 | 2/1992 |
| JP | 5-18751 | 3/1993 |
| JP | 5-208258 | 8/1993 |
| JP | 6-85448 | 3/1994 |
| JP | 6 132649 | 5/1994 |
| JP | 6-181944 | 7/1994 |
| JP | 10-109186 | 4/1998 |
| JP | 2000-334587 | 12/2000 |
| JP | 2001 105168 | 4/2001 |
| JP | 2001110206 A * | 4/2001 |
| JP | 2001-179470 | 7/2001 |
| JP | 2002-1521 | 1/2002 |
| JP | 2003-340582 | 12/2003 |
| JP | 2005-28428 | 2/2005 |
| JP | 2006-229075 | 8/2006 |
| JP | 2006-263771 | 10/2006 |

OTHER PUBLICATIONS

Office Action issued Sep. 20, 2011, in Japanese Patent Application No. 2007-006216 with English translation.

Japanese Office Action issued May 15, 2012 in Patent Application No. 2007-006216 with English Translation.

* cited by examiner

LASER TYPE SOLDERING APPARATUS

TECHNICAL FIELD

The present invention relates to a laser type soldering apparatus which accurately solders electronic parts such as ICs and LSIs or other works by using a laser beam.

BACKGROUND ART

Soldering technologies using a laser beam are well known and disclosed in, for example, the following Patent Documents 1 or 2. In the technologies, the laser beam is projected on a to-be-soldered object such as a printed circuit bard from a soldering head, and a solder is melted with heat of the laser beam, so that soldering can be performed. Therefore, these technologies have an advantage in that the soldering can be performed in a non-contact manner.

However, conventionally, as shown in FIGS. 7 and 8, by projecting a circular laser beam 2 on a to-be-soldered object 3 in a spot shape by a soldering head, a threadlike solder 8 supplied from a nozzle 7 is melted and the soldering is performed. Therefore, in a case where the to-be-soldered object 3 is a annular terminal 4a provided to a board 4 and a bar-shaped terminal 5a of a electronic part inserted therein, the laser beam 2 may be projected on the electronic part 5 through a clearance 6 between the annular terminal 4a and the bar-shaped terminal 5a, so that a portion of the electronic part 5 may be burnt disadvantageously.

In addition, in Patent Documents 3 and 4, disclosed are technologies for heating and machining a to-be-soldered object by using a ring shape laser beam. If the soldering of the annular terminal 4a and the bar-shaped terminal 5a is performed by using such a ring shape laser beam, the aforementioned problem of the burning of the electronic part may be solved.

Patent Document 1: Japanese Patent Application Laid-Open (JP-A) No. 4-52073

Patent Document 2: JP-A No. 2002-1521

Patent Document 3: JP-A No. 2005-28428

Patent Document 4: JP-A No. 2006-229075

However, the ring shape laser beam can heat only the annular terminal 4a. That is, the bar-shaped terminal 5a disposed at the central portion cannot be heated. Therefore, the melted solder is rapidly cooled down by a low temperature of the bar-shaped terminal 5a. As a result, the soldering deteriorates, and soldering time is increased, so that work efficiency is lowered. Particularly, in a case where the many soldering points are consecutively soldered by a soldering robot, the entire work efficiency is greatly lowered.

DISCLOSURE OF THE INVENTION

Problem to be Solved by the Invention

An object of the invention is to provide a laser type soldering apparatus having a simple construction capable of efficiently performing soldering without occurrence of a problem of burning of an electronic part by projecting a laser beam having a particular shape to heat a to-be-soldered object, even if in a case where the to-be-soldered object is the annular terminal and the bar-shaped terminal inserted therein.

In order to solve the above problems, there is provided a soldering apparatus which is configured to convert a laser beam to a laser beam having a required diameter and a shape by using a plurality of optical lens to project the laser beam on a to-be-soldered object, wherein a portion of the optical lenses is formed of a conical lens. A incident surface or emitting surface of the conical lens is a conical surface, and a central portion thereof has a central hole having a diameter smaller than that of a circular laser beam that is incident to the conical lens. The conical lens converts the circular laser beam to a double circular beam having a ring portion with a circular ring shape and a spot portion located at a center of the ring portion, and the double circular beam is projected on the to-be-soldered object.

Accordingly, even in a case where the to-be-soldered object is the annular terminal and the bar-shaped terminal inserted therein, the annular terminal and the bar-shaped terminal can be heated by the double circular beam, so that the soldering can be efficiently performed without occurrence of the problem of burning of the electronic part. In addition, since the double circular beam can be formed by using a simple construction including the conical lens having the central hole, the construction of the soldering apparatus can be simplified.

In the invention, preferably, the soldering apparatus may include an incident unit to which a laser beam output from a laser oscillator is incident and a projecting unit that projects a laser beam output from the incident unit on the to-be-soldered object. The incident unit and the projecting unit are disposed so that an optical axis can be refracted at an angle of 90 degree by the intermediary of a semitransparent mirror, and the conical lens is disposed to the projecting unit. In addition, the soldering apparatus includes a CCD camera for photographing the to-be-soldered object. The CCD camera is disposed so that a photographing optical axis is coincident with the optical axis of the projecting unit, and the to-be-soldered object is photographed through the central hole of the conical lens and the semitransparent mirror.

Alternatively, instead of disposing the conical lens to the emitting unit, the conical lens is disposed to the incident unit, so that the to-be-soldered object is photographed through the optical lens other than the conical lens by the CCD camera.

In one embodiment of the invention, the soldering apparatus may include one conical lens. The conical surface of the conical lens is a convex conical surface, and the conical lens is disposed such that the conical surface is the emitting surface at a position among a sequence of a plurality of the optical lenses which is closest to the to-be-soldered object.

In addition, in another embodiment of the invention, the soldering apparatus may include two conical lenses. The conical surface of the one conical lens is a concave conical surface and the conical surface of the other conical lens is a convex conical surface, and the conical lenses are disposed so that the concave conical surface and the convex conical surface face each other.

REFERENCE NUMERALS

Figure 1:
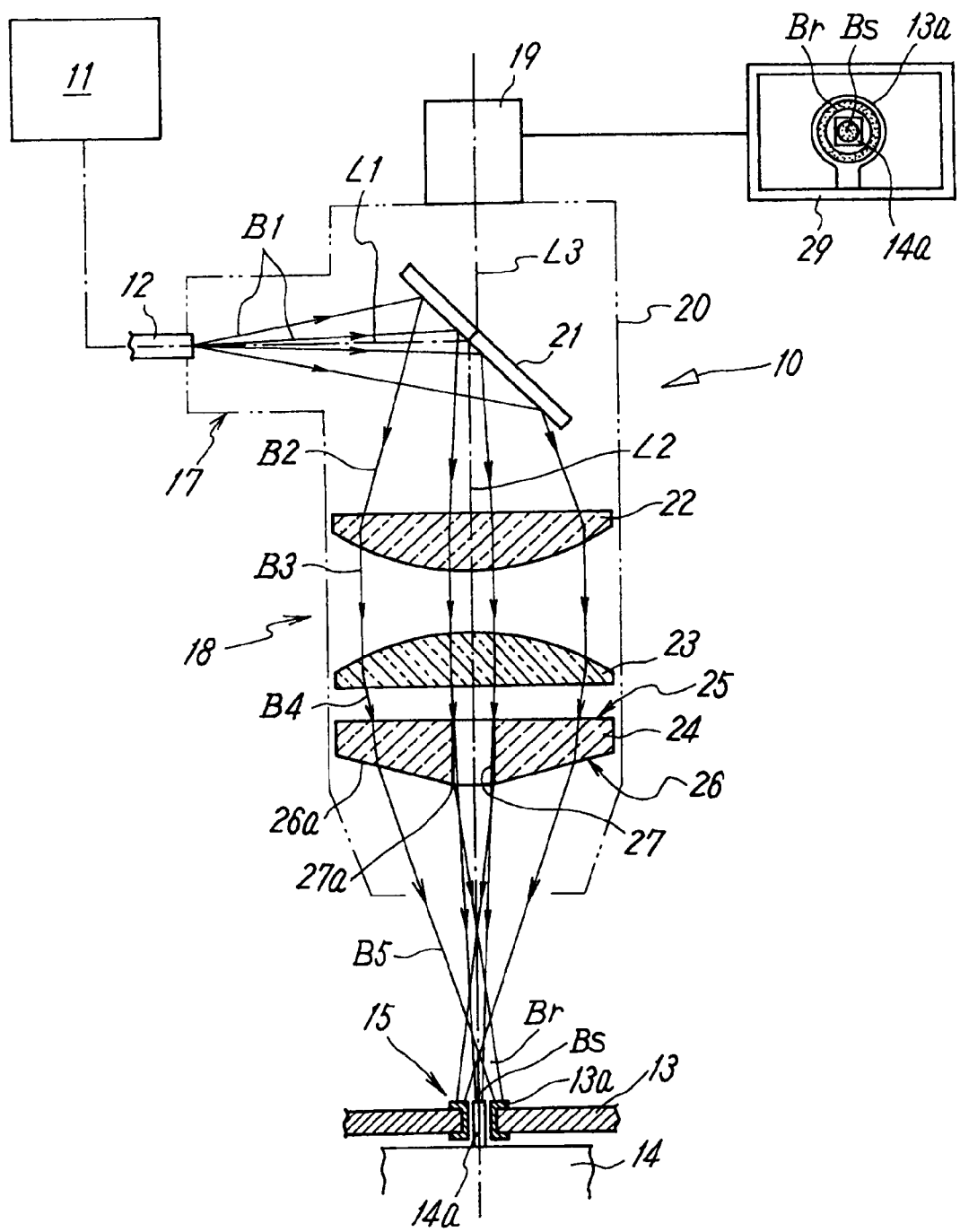
FIG. 1 is a view schematically illustrating a construction of a laser type soldering apparatus according to a first embodiment of the invention.

11: laser oscillator
15: to-be-soldered object
17: incident unit
18: projecting unit
19: CCD camera
21: semitransparent mirror
22: optical lens (first convex lens)
23: optical lens (second convex lens)
24, 33, 34: conical lens
25: incident surface
26, 37a: emitting surface
26a, 40a: conical surface
27, 38, 42: central hole
32, 44: optical lens (convex lens)
Br: ring portion
Bs: spot portion
L1: incident-unit optical axis
L2: projecting-unit optical axis
L3: photographing optical axis

BEST MODE FOR CARRYING OUT THE INVENTION

FIG. 1 is a view schematically illustrating a construction of a laser type soldering apparatus according to a first embodiment of the invention. In the figure, reference numeral 10 denotes a soldering head the is provided with a multi-joint arm of a soldering robot (not shown), reference numeral 11 denotes a laser oscillator that outputs a laser beam B1, and reference numeral 12 denotes an optical fiber that guides a laser beam B1 output from the laser oscillator 11 to the soldering head 10. In addition, reference numeral 13 denotes a board on which printed lines are provided, and reference numeral 14 denotes an electronic part that is to be soldered on the board 13. The soldiering is performed in the state that a bar-shaped terminal 14a of the electronic part 14 is inserted into an annular terminal 13a that is provided to the board 13. Therefore, the annular terminal 13a and the bar-shaped terminal 14a are a to-be-soldered object 15.

The soldering head 10 include an incident unit 17 to which the laser beam B1 output from the laser oscillator 11 is incident through the optical fiber 12, a projecting unit 18 which projects the incident laser beam B1 to the to-be-soldered object 15, and a CCD camera 19 which photographs the to-be-soldered object 15.

The incident unit 17 and the projecting unit 18 are disposed inside a cylindrical housing 20 in the state that optical axes, that is, an incident-unit optical axis L1 and a projecting-unit optical axis L2 is refracted at an angle of 90 degree at the semitransparent mirror 21 as a boundary. The CCD camera 19 is provided to an upper portion of the housing 20 so that a photographing optical axis L3 is substantially coincident with projecting-unit optical axis L2.

The semitransparent mirror 21 has a property of reflecting only the laser beam B1 output from the laser oscillator 11 without transmission thereof but transmitting other lights (visible light). The semitransparent mirror 21 is disposed at an angle of 45 degree with respect to each of the incident-unit optical axis L1 and the projecting-unit optical axis L2, so that the circular laser beam B1 incident from the incident unit 17 is reflected to the direction of the projecting-unit optical axis L2.

In the projecting unit 18, the semitransparent mirror 21 and a plurality of optical lenses 22, 23, and 24 that convert the laser beam to a laser beam having a required diameter and a shape are sequentially disposed along the projecting-unit optical axis L2.

In each of the two optical lenses, that is, the first and second optical lenses 22 and 23 disposed to the side of the semitransparent mirror 21 among a plurality of the optical lenses 22, 23, and 24, one surface or both surfaces thereof may become a convex spherical surface. Each of the two optical lenses 22 and 23 is convex lens where a thickness of the central portion is larger than a thickness of the circumferential portion. The one optical lens 24 disposed nearest to the to-be-soldered object 15 is a conical lens of which one surface is a conical surface 26a. The conical surface 26a of the conical lens 24 is disposed as an emitting surface to face the to-be-soldered object 15.

Next, when the laser beam B2 reflected by the semitransparent mirror 21 is incident to the first optical lens 22 as a enlarged beam of which diameter is enlarged, a collimated laser beam B3 is formed by the first optical lens 22 to be incident to the second optical lens 23 in the next stage. Next, a laser beam B4 of which diameter is gradually decreased by the convergence of the second optical lens 23 is formed to be incident to the conical lens 24.

The principle and functions of the conical lens 24 are described with reference to a general conical lens 24a shown in FIG. 2. The conical lens 24a has an incident surface 25 that is a plane perpendicular to the axis line and an emitting surface 26 having a shape of a conical surface. When the circular laser beam Bi incident from the incident surface 25 is emitted from the emitting surface 26, the laser beam Bi is refracted at different angles by the conical surface 26a and the vertex 26b of the conical surface 26a, so that the laser beam Bi is converted to a ring shape laser beam Bo. When the emitted laser beam Bo is projected on a plane A, the pattern thereof has a ring shape as shown in FIG. 3.

However, the conical lens 24 according to the embodiment of FIG. 1 has a central hole 27 that penetrates the conical lens 24 in the optical line direction at the central portion of the conical lens 24 as well as the planar incident surface 25 perpendicular to the projecting-unit optical axis L2 and the emitting surface 26 constructed with the conical surface 26a, so that the central hole 27 is disposed on the projecting-unit optical axis L2. The central hole 27 has a diameter smaller than an outer diameter of the incident circular laser beam B4 to transmit a portion of the laser beam B4, so that the central hole 27 can emits a small-diameter circular beam. In addition, the hole edge portion 27a of the central hole 27 disposed at the side of the emitting surface 26 corresponds to the vertex 26b of the general conical lens 24a.

Figure 4:
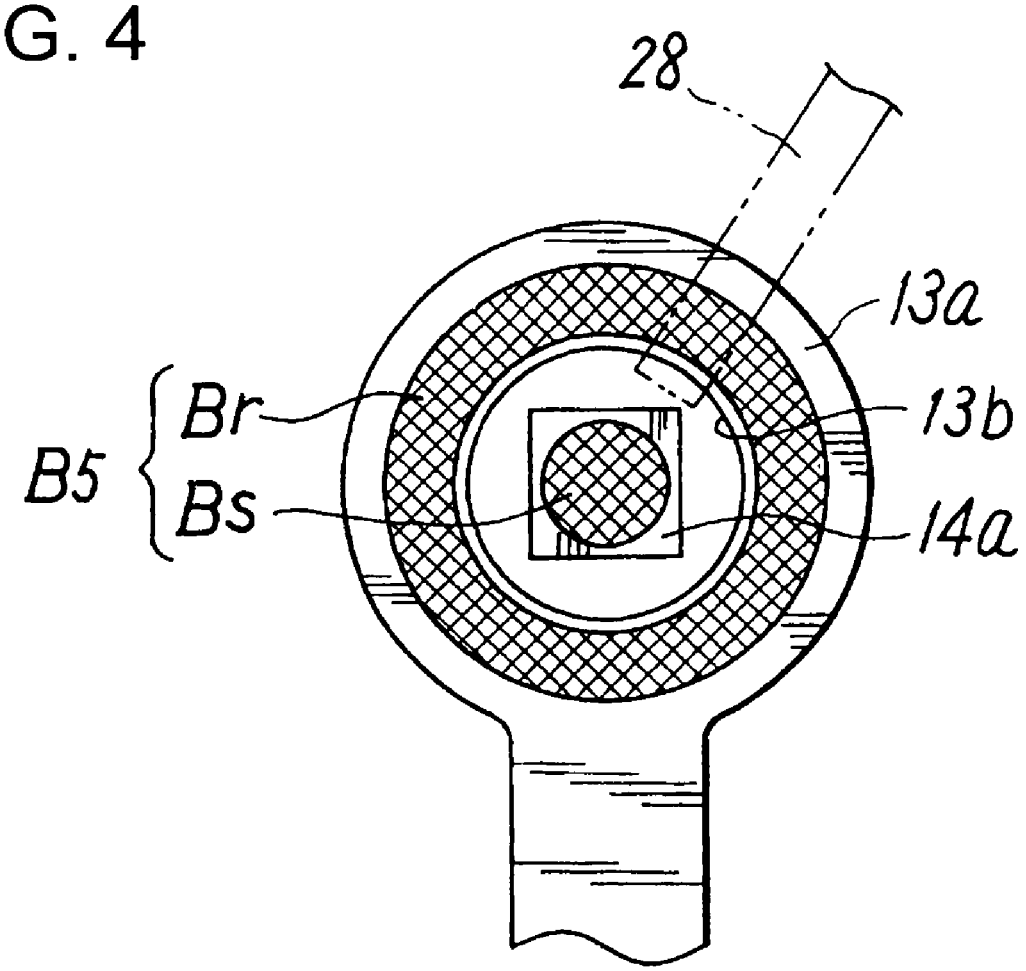
FIG. 4 is a plan view illustrating main components of a projecting pattern of a laser beam that is projected on a to-be-soldered object from the soldering apparatus of FIG. 1.

Therefore, as shown in FIG. 4, the laser beam B5 emitted from the conical lens 24 has a ring portion Br that is emitted from the conical surface 26a with a circular ring shape and a spot portion Bs that is emitted from the central hole 27. The spot portion Bs is positioned at the center of the ring portion Br. In addition, in the following description, the laser beam having the ring portion Br and the spot portion Bs is referred to as a "double circular beam".

The ring portion Br is projected on the annular terminal 13a so as to surround the circumference of the terminal hole 13b to heat the annular terminal 13a, and the spot portion Bs is projected on the bar-shaped terminal 14a in a spot shape to heat the bar-shaped terminal 14a. Therefore, in the state, the threadlike solder 28 is melted by the double circular beam B5, so that the two terminals 13a and 14a are soldered. As a result, the annular terminal 13a and the bar-shaped terminal 14a are heated by the ring portion Br and the spot portion Bs without occurrence of the problem of burning of the electronic part 14, so that the soldering can be rapidly and efficiently performed in a short time.

In the embodiment shown in the drawing, since the laser beam B4 converged by the second optical lens 23 is incident to the conical lens 24, the circular beam (spot portion Bs) that penetrates the central hole 27 is also in the converged state, and thus, the diameter thereof is gradually decreased. Therefore, the diameter of the double circular beam projected on the to-be-soldered object 15, that is, the spot diameter of the spot portion Bs, the ring diameter and width of the ring portion Br can be adjusted in accordance with the to-be-soldered object 15 by changing a distance between the conical lens 24 and the second optical lens 23 or the to-be-soldered object 15.

On the other hand, although a collimated laser beam is allowed to be incident to the conical lens 24, in this case, the circular beam penetrating the central hole 27, that is, the spot portion Bs is also a collimated light, so that the diameter thereof becomes substantially equal to the diameter of the central hole 27. Therefore, in this case, only the ring diameter and width of the ring portion Br can be adjusted by changing the distance between the conical lens 24 and the to-be-soldered object 15.

The CCD camera 19 is disposed so that the photographing optical axis L3 is coincident with the projecting-unit optical axis L2, so that the to-be-soldered object 15 is photographed through the central hole 27 of the conical lens 24, the optical lenses 23 and 22, and the semitransparent mirror 21. An image of the to-be-soldered object photographed by the CCD camera 19 is displayed on a monitor 29. For example, in a teaching step before performing the soldering, the image can be used for positioning the projecting position of the double circular beam B5 on the to-be-soldered object 15. In addition, at the time of performing the soldering, the image can be used for checking whether or not the soldering is normally performed. However, these techniques are disclosed in JP-A No. 2002-1521. In addition, these techniques do not directly relate to the spirit of the invention. Therefore, detailed description thereof is omitted.

In addition, although no optical lens is disposed to the incident unit 17, one or more optical lenses (convex lenses) may also be disposed to the incident unit 17 if needed. Similarly, one or more optical lenses may also be disposed between the semitransparent mirror 21 and the CCD camera 19.

Due to such a simple construction where the conical lens 24 having the central hole 27 is disposed to the projecting unit 18, the conical lens 24 forms the double circular beam B5 having the ring portion Br and the spot portion Bs. Due to the double circular beam B5, even in a case where the to-be-soldered object 15 is the annular terminal 13a and the bar-shaped terminal 14a inserted therein, the soldering can be rapidly and efficiency performed by simultaneously heating the annular terminal 13a and the bar-shaped terminal 14a.

In addition, since the to-be-soldered object 15 can be observed without image deformation by using the central hole 27 of the conical lens 24, the CCD camera 19 can be disposed even in the structure that the conical lens 24 is disposed to the projecting unit 18.

Figure 2:
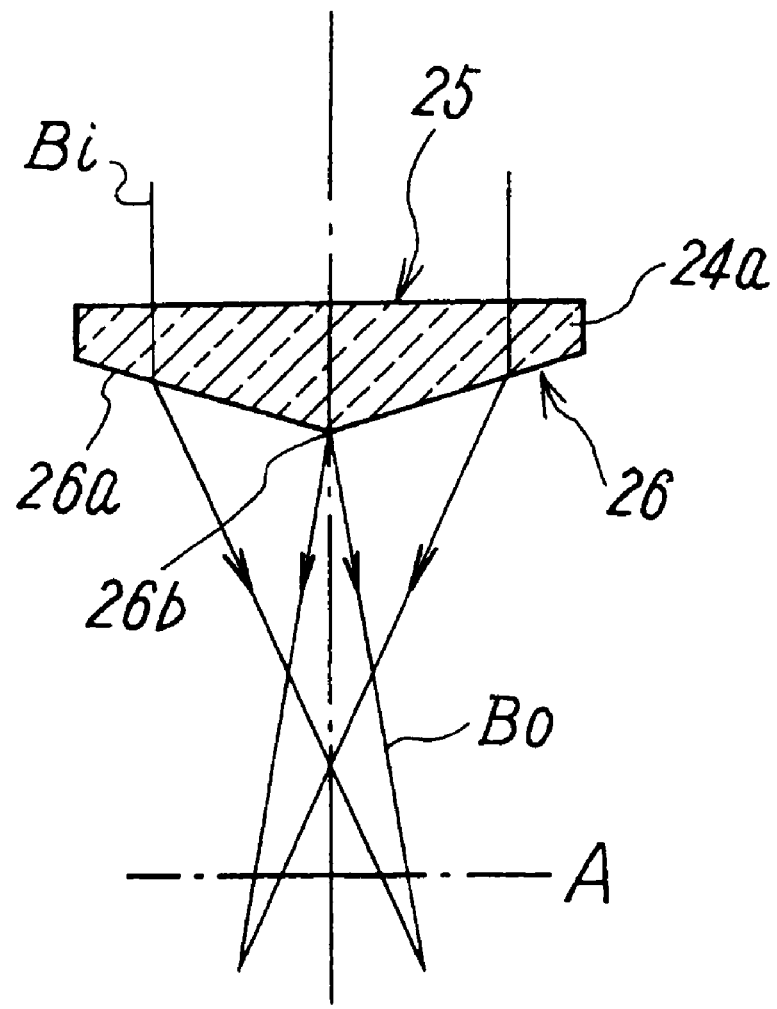
FIG. 2 is a view for explaining functions of a general conical lens having no central hole.
Figure 3:
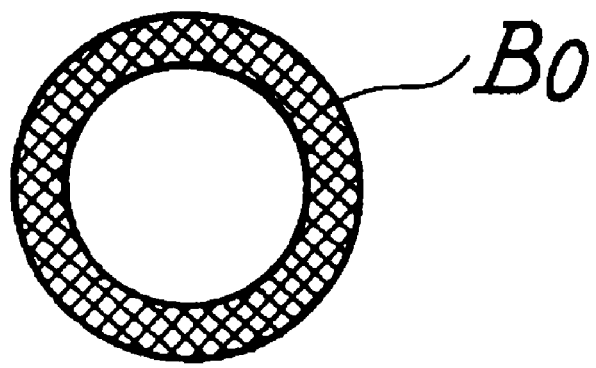
FIG. 3 is a plan view illustrating a pattern of a laser beam emitted from the conical lens of FIG. 2.

On the other hand, as shown in FIG. 2, in a case where a general conical lens 24a having no central hole is disposed to the projecting unit 18, the image is deformed due to the light refraction, so that it is difficult for the CCD camera 19 to photograph the to-be-soldered object.

In addition, the position and orientation of the conical lens 24 are not limited to those of the aforementioned embodiment. In a case where the conical lens 24 is disposed at a different position and orientation, the double circular beam B5 having the ring portion Br and the spot portion Bs, as described above, can be formed by combining the conical lens 24 with other convex lenses. In a case where the orientation of the conical lens 24 is reversed, the conical surface 26a becomes an incident surface, and the opposite plane becomes an emitting surface.

In addition, although the CCD camera 19 is not provided, the object of the invention can be achieved. In this case, the semitransparent mirror 21 may be removed, and the incident-unit optical axis L1 may be coincident with the projecting-unit optical axis L2. Therefore, the laser beam can be incident from one end side of the projecting unit 18 along the projecting-unit optical axis L2.

Figure 5:
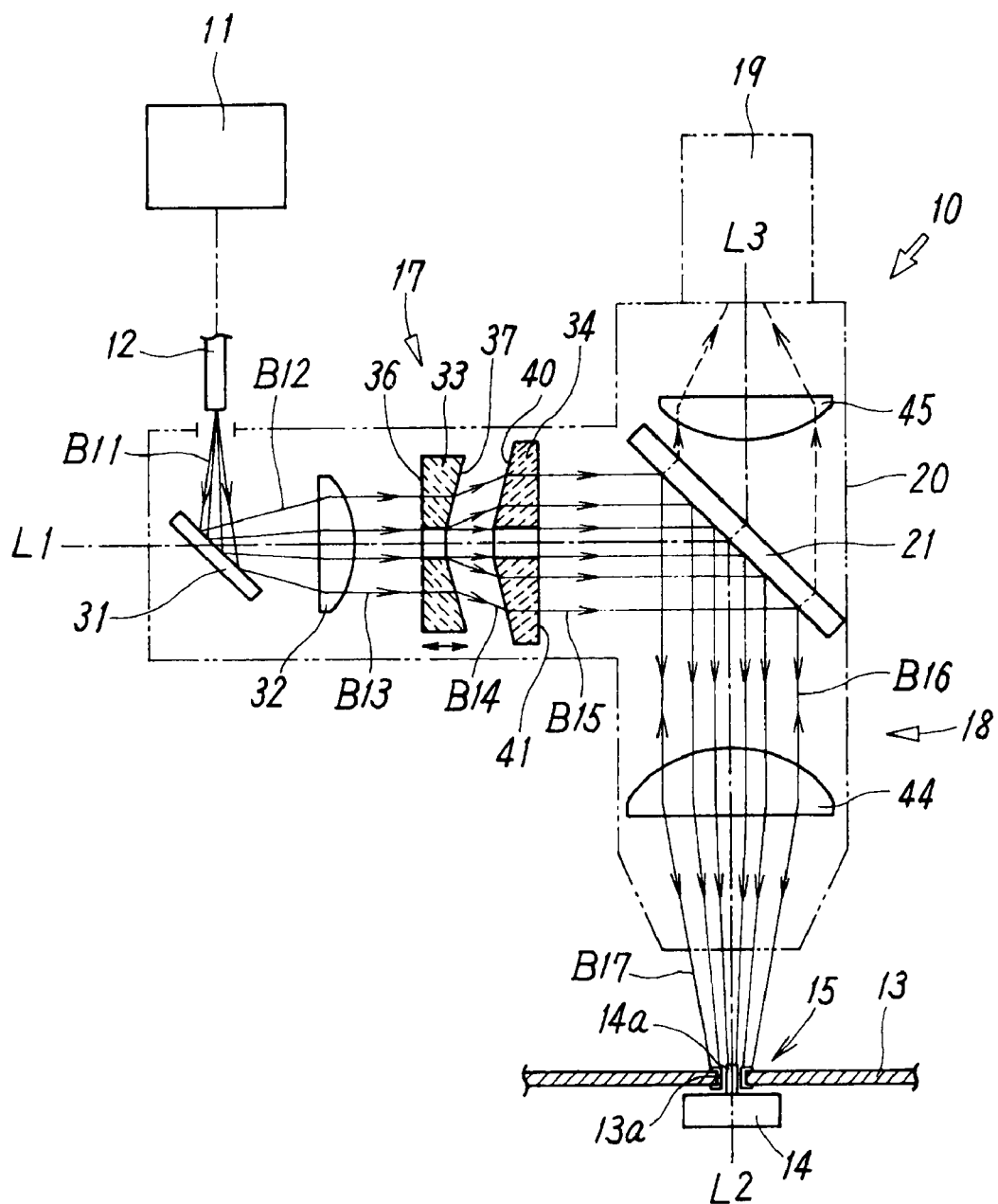
FIG. 5 is a view schematically illustrating a construction of a laser type soldering apparatus according to a second embodiment of the invention.

FIG. 5 is a view schematically illustrating a construction of a soldering apparatus according to a second embodiment of the invention. The soldering apparatus according to the second embodiment is different from the soldering apparatus according to the first embodiment in that a conical lens is disposed to an incident unit.

That is, the incident unit 17 includes a reflecting mirror 21 that reflects a circular laser beam B11 supplied through a optical fiber 12 along the incident-unit optical axis L1, an incident optical lens 32 that converts the laser beam B12 reflected by the reflecting mirror 31 to a collimated laser beam B13 having a predetermined diameter, and first and second conical lenses 33 and 34 that convert the laser beam B13 collimated by the optical lens 32 to double circular laser beams (double circular beams) B14 and B15. The reflecting mirror 31, the incident optical lens 32, and the conical lenses 33 and 34 are sequentially disposed along the incident-unit optical axis L1. The incident optical lens 32 is a convex lens.

Figure 6:
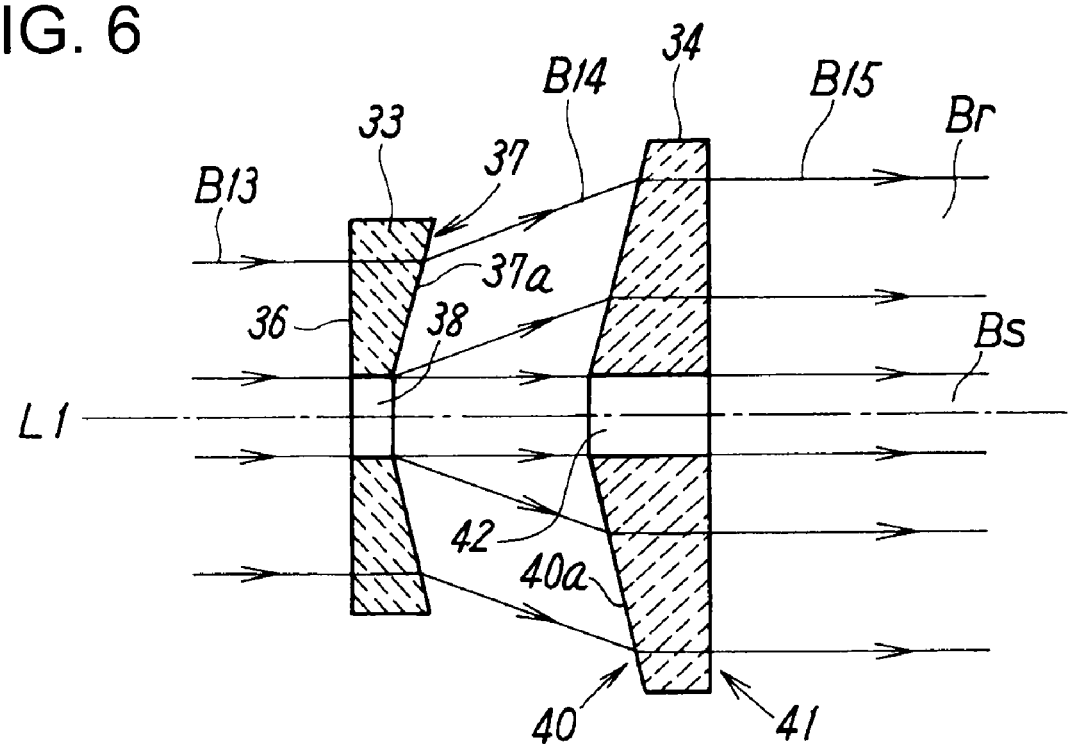
FIG. 6 is an enlarged view illustrating main components of FIG. 5.
Figure 7:
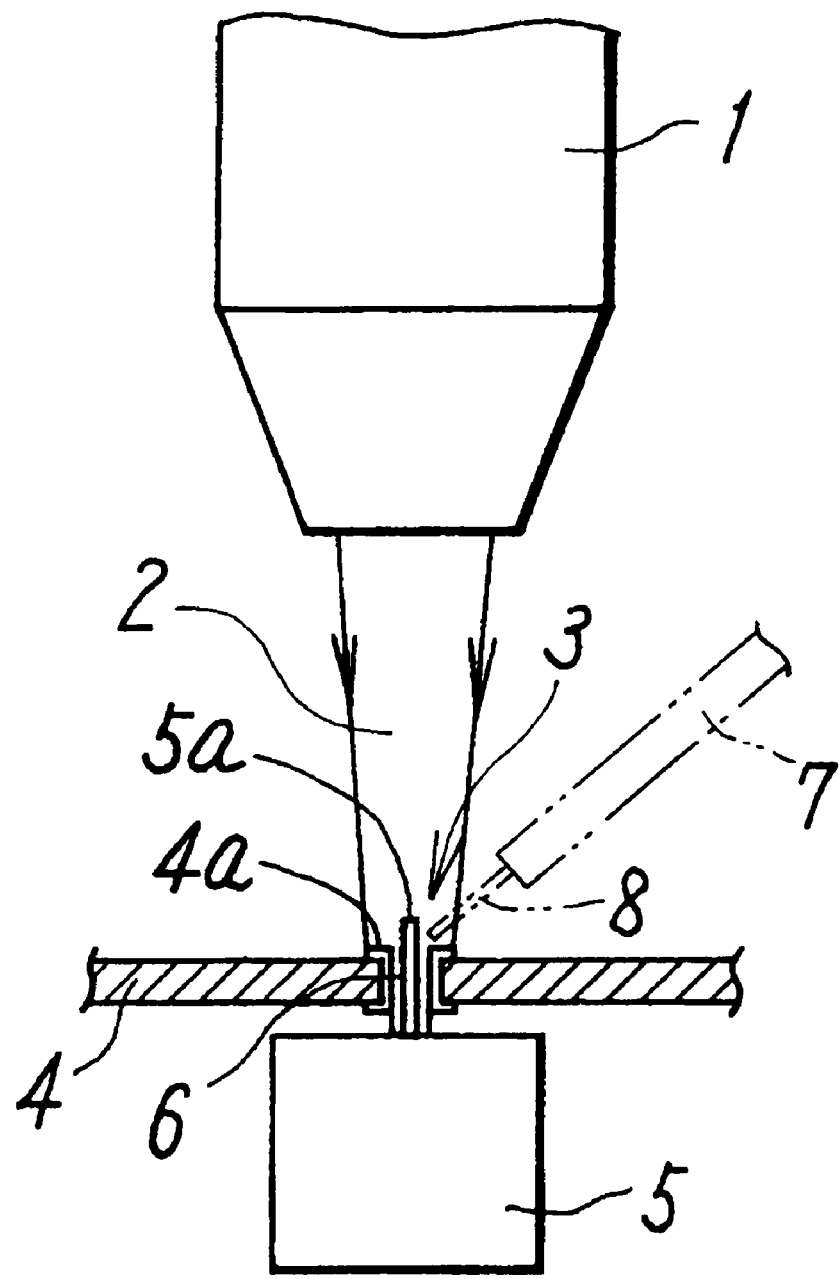
FIG. 7 is a side view illustrating main components of a conventional soldering apparatus.
Figure 8:
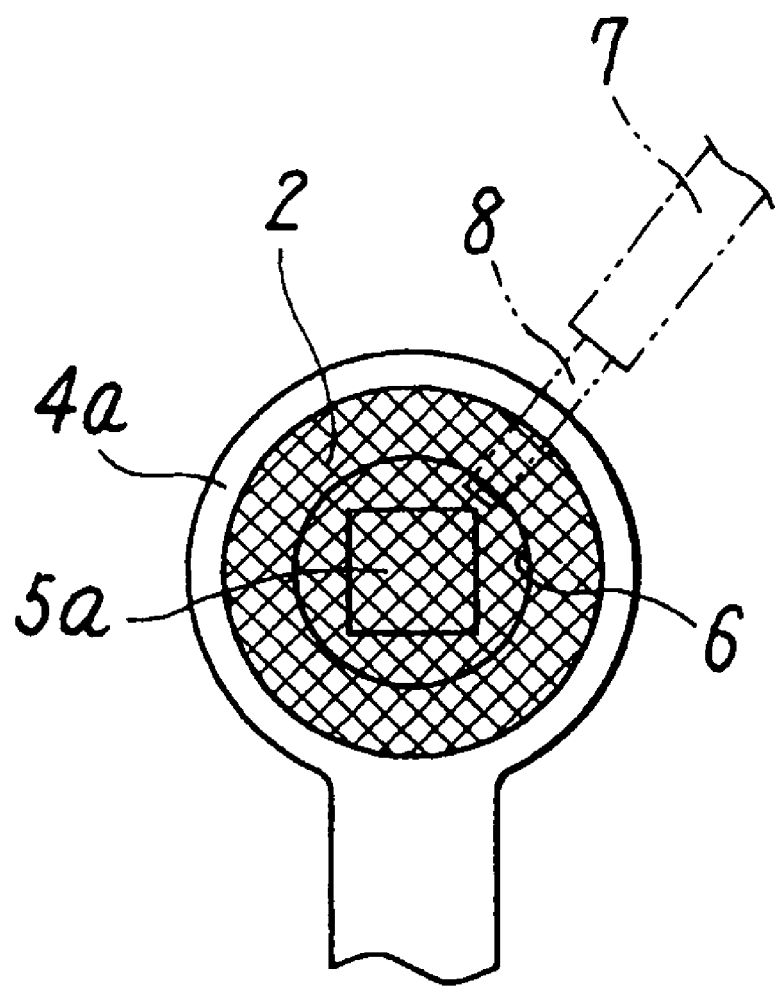
FIG. 8 is a plain view illustrating main components of a projecting pattern of a laser beam that is projected from a conventional soldering apparatus.

As shown in FIG. 6, the first conical lens 33 has a planar incident surface 36 that is perpendicular to the incident-unit optical axis L1, an emitting surface 37 that is a concave conical central surface 37a, a circular central hole 38 that penetrates a central portion of the first conical lens 33 in the optical line direction. The second conical lens 34 has an incident surface 40 that is a convex conical surface 40a, a planar emitting surface 41 that is perpendicular to the incident-unit optical axis L1, and a circular central hole 42 that penetrates a central portion of the second conical lens 34 in the optical line direction. The pair of conical lenses 33 and 34 is disposed in a concentric shape by facing the conical surfaces 37a and 40a each other at a predetermined distance therebetween and by coinciding the central optical lines thereof with the incident-unit optical axis L1.

Inclination angles of the conical surfaces 37a and 40a of the conical lenses 33 and 34 are preferably equal to each other. In addition, diameters of the central holes 38 and 42 of the conical lenses 33 and 34 are preferably equal to each other. Alternatively, the diameter of the central hole 42 of the second conical lens 34 may be slightly larger than that of the central hole 38 of the first conical lens 33.

Now, the collimated circular laser beam B13 is incident from the planar incident surface 36 of the first conical lens 33, the laser beam B13 emitted from the emitting surface 37 through the concave conical surface 37a and the central hole 38 of the emitting surface 37 is divided into a refracted beam and a straightly propagating beam, so that the laser beam B13 is converted to the double circular beam B14 having the ring portion Br and the spot portion Bs. The double circular beam B14 is incident from the convex conical surface 40a of the incident surface 40 of the following second conical lens 34 to be emitted from the emitting surface 41 and penetrates the central hole 42, so that the double circular beam B14 is converted to the collimated double circular beam B15 having the beam pattern shown in FIG. 4. The double circular beam B15 is reflected by the semitransparent mirror 21 and after that, it is projected on the to-be-soldered object 15 through the projecting unit 18.

Although the first conical lens 33 and the second conical lens 34 may be disposed at a predetermined distance, as shown in the drawing, the second conical lens 34 may be fixed, and the first conical lens 33 may be variably positioned along the incident-unit optical axis L1. That is, at least one of the conical lenses 33 and 34 may be variably positioned so as to adjust the distance between the conical lenses 33 and 34 so that the diameter of the double circular beam can be changed.

On the other hand, the projecting unit 18 includes one optical lens 44 or a plurality of optical lenses 44 that are disposed along the projecting-unit optical axis L2. The optical lens 44 is a convex lens. The double circular beam B16 reflected by the semitransparent mirror 21 is converged by the optical lens 44 to be converted to a double circular beam B17 having a ring portion with predetermined diameter and width and a spot portion having a predetermined diameter. The double circular beam B17 is projected on the to-be-soldered object 15.

In the figure, reference numeral 45 denotes an imaging lens. The imaging lens 45 is disposed between the CCD camera 19 and the semitransparent mirror 21 along the photographing optical axis L3. The imaging lens 45 is a convex lens.

In the second embodiment, the photographing of the to-be-soldered object 15 by the CCD camera 19 is performed using the optical lens 44 formed of a convex lens and the semitransparent mirror 21 instead of using the central hole of the conical lens according to the first embodiment.

In the second embodiment, components except for the aforementioned components are substantially the same as those of the first embodiment. The same components as those of the first embodiment are denoted by the same reference numerals, and description thereof is omitted.

In addition, in the second embodiment, a first conical lens 33 having a concave shape and a second conical lens 34 having a convex shape may be disposed to the projecting unit 18.

The invention claimed is:

1. A laser type soldering apparatus which has a laser oscillator outputting a laser beam and a plurality of optical lenses converting the laser beam output from the laser oscillator to a laser beam having a required diameter and shape to perform soldering by projecting the laser beam through the optical lenses on a to-be-soldered object, wherein
one of the optical lenses is a conical lens,
the conical lens has a planar incident surface and an emitting surface with a convex conical surface, and a central portion thereof has a central hole having a diameter smaller than that of a circular laser beam that is incident to the conical lens, and
the conical lens is disposed such that the emitting surface having the conical surface faces the to-be-soldered object at a position where the conical lens among a sequence of a plurality of optical lenses is closest to the to-be-soldered object, and
the conical lens converts the circular laser beam to a double circular beam having a ring portion with a circular ring shape and a spot portion located at a center of the ring portion so that the double circular beam is projected on the to-be-soldered object.

2. The laser type soldering apparatus of claim 1, wherein
the soldering apparatus includes an incident unit to which the laser beam is input from the laser oscillator and a projecting unit which projects the laser beam on the to-be-soldered object from the incident unit,
the incident unit and the projecting unit are disposed so that an optical axis of the incident unit and an optical axis of the projecting unit can be refracted at an angle of 90 degrees by a semitransparent mirror,
the conical lens is disposed in the projecting unit,
the soldering apparatus has a CCD camera for photographing the to-be-soldered object,
the CCD camera is disposed so that a photographing optical axis is coincident with the optical axis of the projecting unit, and
the to-be-soldered object is photographed through the central hole of the conical lens and the semitransparent mirror.

3. The laser type soldering apparatus of claim 2, wherein
the projecting unit includes a first convex lens which converts an enlarged beam reflected by the semitransparent mirror to a collimated beam, a second convex lens which converts the collimated beam output from the first convex lens to a converged beam, and the conical lens which converts the converged beam output from the second convex lens to a double circular laser beam.

4. The soldering apparatus of claim 1, wherein an inner diameter of the ring portion of the double circular beam is separated from an outer diameter of the spot portion of the double circular beam by a first distance.

5. A laser type soldering apparatus which has a laser oscillator outputting a laser beam and a plurality of optical lenses converting the laser beam output from the laser oscillator to a laser beam having a required diameter and shape to perform soldering by projecting the laser beam through the optical lenses on a to-be-soldered object, wherein
the soldering apparatus includes an incident unit to which the laser beam is input from the laser oscillator and a projecting unit which projects the laser beam output from the incident unit on the to-be-soldered object,
the incident unit and the projecting unit are disposed so that an optical axis of the incident unit and an optical axis of the projecting unit are refracted at an angle of 90 degrees by a semitransparent mirror,
the plurality of optical lenses includes a first conical lens and a second conical lens,
the first conical lens has a planar incident surface, an emitting surface having a concave conical surface, and a first central hole,
the second conical lens has an incident surface with a convex conical surface, a planar emitting surface, and a second central hole,
the first conical lens and the second conical lens are disposed within the incident unit so that the concave conical surface and the convex conical surface face each other, and the first conical lens and the second conical lens convert a circular laser beam to a double circular beam having a ring portion with a circular ring shape and a spot portion located at a center of the ring portion so that the double circular beam is input to the semitransparent mirror.

6. The soldering apparatus of claim 5, wherein
the soldering apparatus has a CCD camera for photographing the to-be-soldered object,
the CCD camera is disposed so that a photographing optical axis is coincident with the optical axis of the projecting unit, and
the to-be-soldered object is photographed through an optical lens disposed in the projecting unit and through the semitransparent mirror.

7. The soldering apparatus of claim 5, wherein
the incident unit includes a convex lens which converts an input enlarged beam to a collimated beam and the two conical lenses which convert the collimated beam output from the convex lens to the double circular beam and input the double circular beam to the semitransparent mirror, and
the projecting unit includes a convex lens which causes the double circular beam reflected by the semitransparent mirror to converge and projects the double circular beam on the to-be-soldered object.

8. The soldering apparatus of claim 5, wherein an inner diameter of the ring portion of the double circular beam is separated from an outer diameter of the spot portion of the double circular beam by a first distance.

* * * * *